US008395447B2

(12) United States Patent
Nakahashi et al.

(10) Patent No.: US 8,395,447 B2
(45) Date of Patent: Mar. 12, 2013

(54) LOW-NOISE AMPLIFIER (75) Inventors: Yusuke Nakahashi, Osaka (JP); Naoki Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/179,339

(22) Filed: Jul. 8, 2011

(65) Prior Publication Data

US 2012/0154047 A1 Jun. 21, 2012

(30) Foreign Application Priority Data

Dec. 20, 2010 (JP) ................... 2010-282888

(51) Int. Cl.
 *H03F 3/45* (2006.01)
(52) U.S. Cl. ....................... 330/254; 330/282
(58) Field of Classification Search .................. 330/285, 330/296, 273, 254, 282
See application file for complete search history.

(56) References Cited

U.S. PATENT DOCUMENTS

| 6,404,284 | B1 | 6/2002 | Johnson |
| 6,717,471 | B2 | 4/2004 | Arayashiki et al. |
| 6,735,424 | B1 * | 5/2004 | Larson et al. ............ 455/250.1 |
| 7,262,665 | B1 | 8/2007 | Jin et al. |
| 2008/0284510 | A1 | 11/2008 | Drogi et al. |

FOREIGN PATENT DOCUMENTS

JP 2003-218653 7/2003

* cited by examiner

*Primary Examiner* — Hieu Nguyen
(74) *Attorney, Agent, or Firm* — McDermott Will & Emery LLP (57) ABSTRACT

A low-noise amplifier comprises an input terminal to which a signal is input; a transistor configured to amplify the signal input to the input terminal; an output terminal through which the amplified signal from the transistor is output; a feedback amount regulator circuit configured to regulate an amplitude of the signal output from the transistor as a feedback amount and output a voltage; a bias circuit configured to generate a bias current fed to the transistor; a differential voltage comparator configured to compare the voltage output from the feedback amount regulator circuit to a reference voltage, determine whether or not a level of the signal input to the input terminal is a level at which a gain of the transistor is suppressed, and increase the bias current fed to the transistor when the differential voltage comparator determines that the level of the signal input to the input terminal is the level at which the gain of the transistor is suppressed; a first input bias circuit configured to generate the reference voltage and apply the reference voltage to one input end of the differential voltage comparator; and a second input bias circuit configured to add a bias voltage to the voltage output from the feedback amount regulator circuit and apply the voltage added with the bias voltage to the other input end of the differential voltage comparator.

4 Claims, 5 Drawing Sheets

LOW-NOISE AMPLIFIER

RELATED APPLICATIONS

The disclosure of Japanese Patent Application No. 2010-282888 filed on December, 20, 2010 including specification, drawings and claims is incorporated herein by reference in its entirety.

BACKGROUND ART

1. Field of the Invention

The present invention relates to a low-noise amplifier. Particularly, the present invention relates to a low-noise amplifier incorporated into a receiver section of a communication device.

2. Description of the Related Art

In recent years, with advancement of radio communication technologies, communication devices have been developed to enhance their function. For example, it is demanded that a plurality of communication systems be incorporated into a single communication device. In such a communication device, the plurality of communication systems include transmission circuits independent of each other, respectively, and receiving circuits independent of each other, respectively, and are operative simultaneously. For this reason, in some occasions, a high-level disturbing (interfering) wave signal from a transmission circuit in a particular communication system leaks into receiving circuits in other communication systems. For example, in a configuration of MIMO (multiple-input and multiple-output) in which a plurality of signals are transmitted and received simultaneously to enhance a communication speed, even in a communication device incorporating a single communication system, a disturbing wave signal with a higher level than a desired wave is input to a receiving circuit. From now on, it is expected that the communication device is small-sized and the number of communication systems incorporated into the communication device increases. Therefore, there will be a tendency that an influence of the disturbing wave signal increases. Under the circumstance, it is demanded that high-communication quality be maintained.

Figure 6:
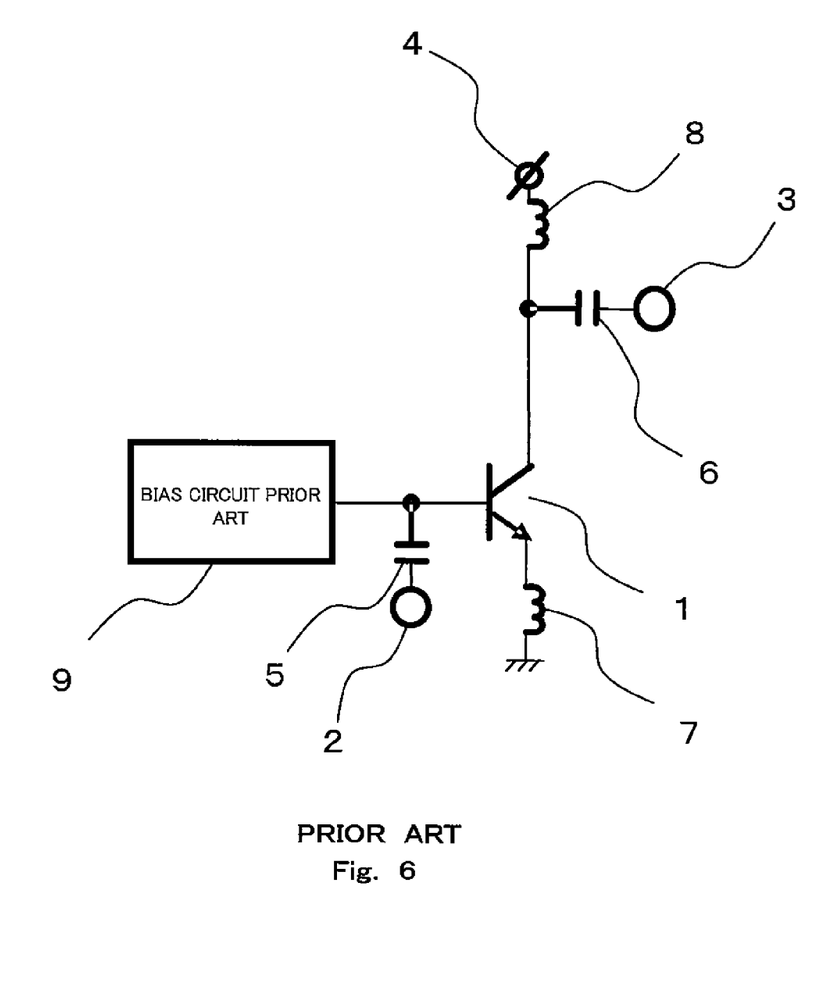
FIG. 6 is a circuit diagram showing a configuration of a low-noise amplifier incorporated into a receiver circuit in a communication system.

FIG. 6 is a circuit diagram showing a configuration of a low-noise amplifier used in a receiving circuit in a communication system. Referring to FIG. 6, the low-noise amplifier includes a NPN-type transistor 1, an input terminal 2 connected to a base of the NPN-type transistor 1 via a DC cut capacitor 5, an output terminal 3 connected to a collector of the NPN-type transistor 1 via a DC cut capacitor 6, an inductor 7 connected to an emitter of the NPN-type transistor 1 and to a ground, an inductor 8 connected to a collector of the NPN-type transistor 1 and to a power supply terminal 4, and a bias circuit 9 for supplying a bias current to the base of the NPN-type transistor 1. The NPN-type transistor 1 constitutes an amplifier element which amplifies a signal input thereto through the input terminal 2 via the DC cut capacitor 5 and outputs the amplified signal to the output terminal 3 via the DC cut capacitor 6.

The low-noise amplifier shown in FIG. 6 is designed on the basis of a performance in a case where a weak electric field is input, because the signal input to the input terminal 2 typically has a low level. Under an environment in which the high-level disturbing wave signal may be input, an operation point of the low-noise amplifier falls outside a linear region. This results in a problem that a receiving sensitivity of the communication device is degraded due to a suppressed power gain. Accordingly, an approach for increasing the bias current in the low-noise amplifier could be made, to provide a high output of the low-noise amplifier and achieve reduction of the degree to which the power gain is suppressed when the high-level disturbing wave signal is input. However, in this approach, the bias current increases even when the weak electric field is input, thereby resulting in a problem that electric power consumption of the communication device increases.

Under the circumstances, for example, Japanese Laid-Open Patent Application Publication No. 2003-218653 discloses a low-noise amplifier in which an output signal voltage of a signal amplifying dual gate FET is detected by a capacitor and a resistor, and is applied to a gate terminal of an enhancement FET, and the enhancement FET increases a bias current fed to the signal amplifying dual gate FET when a level of an input signal increases up to a level at which a gain of the signal amplifying dual gate FET is suppressed.

SUMMARY OF THE INVENTION

However, in the low-noise amplifier disclosed in Japanese Laid-Open Patent Application Publication No. 2003-218653, the level of the disturbing wave signal for causing the enhancement FET constituting a part of a bias varying unit for the signal amplifying dual gate FET to operate varies depending on a threshold voltage Vt of the enhancement FET or a power supply voltage. For this reason, this low-noise amplifier has a drawback that advantages are not achieved stably when there is a variation in characteristics in elements in manufacturing or a variation in power supply voltages.

The present invention has been developed under the circumstances, and an object of the present invention is to reduce the degree to which a gain of a transistor is suppressed by increasing a bias current fed to a transistor when a high-level disturbing wave signal which causes the gain of the transistor to be suppressed is input, in a case where a weak electric field is input, in a low-noise amplifier. Another object of the present invention is to achieve the above advantage stably, even when there is a variation in characteristics of elements in manufacturing or a change or variation in power supply voltages.

According to the present invention, a low-noise amplifier comprises an input terminal to which a signal is input; a transistor configured to amplify the signal input to the input terminal; an output terminal through which the amplified signal from the transistor is output; a feedback amount regulator circuit configured to regulate an amplitude of the amplified signal output from the transistor as a feedback amount and output a voltage; a bias circuit configured to generate a bias current fed to the transistor; a differential voltage comparator configured to compare the voltage output from the feedback amount regulator circuit to a reference voltage, determine whether or not a level of the signal input to the input terminal is a level at which a gain of the transistor is suppressed, and increase the bias current fed to the transistor when the differential voltage comparator determines that the level of the signal input to the input terminal is the level at which the gain of the transistor is suppressed; a first input bias circuit configured to generate the reference voltage and apply the reference voltage to one input end of the differential voltage comparator; and a second input bias circuit configured to add a bias voltage to the voltage output from the feedback amount regulator circuit and apply the voltage added with the bias voltage to the other input end of the differential voltage comparator.

In accordance with this configuration, when a high-level disturbing wave signal which causes the gain of the transistor to be suppressed is input to the input terminal, in a case where a case a weak electric field is input, in the low-noise amplifier, the degree to which the gain of the transistor is suppressed can be reduced effectively by increasing the bias current fed to the transistor. Also, when the high-level disturbing wave signal is not input, the bias current fed to the transistor is not increased, and as a result, electric power consumption can be suppressed. In addition, by providing first and second input bias circuits for regulating two input biases (bias voltages) of the differential voltage comparator, the above advantage is achieved stably even when there is a variation in the characteristics of elements in manufacturing, or a change or variation in power supply voltages.

In the low-noise amplifier, the feedback amount regulator circuit may have a configuration in which a resistor and a direct current cut capacitor are connected in series.

In accordance with this configuration, it is possible to desirably and easily set the amplitude of the voltage applied from the feedback amount regulator circuit to the other input end of the differential voltage comparator, by impedance of the resistor and the DC cut capacitor. In addition, it is possible to prevent a DC component of the signal output from the transistor from being applied to the other input end of the differential voltage comparator, by using the DC cut capacitor. Thus, the operation of the differential voltage comparator can be stabilized, and the level of the disturbing wave signal at which the bias current fed to the transistor begins to increase does not vary, even when the power supply voltage supplied to the low-noise amplifier varies. As a result, it is possible to stably achieve an effect of reducing degree to which the gain of the transistor is suppressed.

In the low-noise amplifier, the first input bias circuit may include a plurality of resistors connected in series between a power supply terminal and a ground, and may be configured to apply a divided voltage generated by dividing a power supply voltage of the power supply terminal by the plurality of resistors to the one input end of the differential voltage comparator, and the second input bias circuit may include a plurality of resistors connected in series between a power supply terminal and a ground, and may be configured to add a divided voltage generated by dividing a power supply voltage of the power supply terminal by the plurality of resistors to the voltage output from the feedback amount regulator circuit and apply the voltage added with the divided voltage, to the other input end of the differential voltage comparator.

In accordance with this configuration, the level of the disturbing wave signal at which the bias current of the transistor begins to increase can be set desirably and easily merely by regulating (adjusting) a resistance ratio between the plurality of resistors. Because of this, in addition, an influence of a variation in the power supply voltages and a variation in the elements in manufacturing can be lessened, and the effect of reducing the degree to which the gain of the transistor is suppressed can be achieved stably.

In the low-noise amplifier, a signal output from the differential voltage comparator may be input to the bias circuit via at least one current mirror circuit.

In accordance with this configuration, when the level of the disturbing wave signal increases, an increase amount of the bias current fed to the transistor can be desirably and easily set by regulating (adjusting) a mirror ratio of the current mirror circuits. An electric potential at a connection point where the bias circuit is connected to the current mirror circuit, rises with an increase in the bias current fed to the transistor. Therefore, during low-voltage driving, a changing magnitude of the bias current fed to the transistor is restricted by an amount corresponding to a drop (decrease) amount of the power supply voltage. However, a drop (decrease) amount of the voltage in the current mirror circuit corresponds to only a drain-source voltage of the MOSFET constituting the current mirror circuit. Therefore, even during low-voltage driving, a changing magnitude of the bias current fed to the transistor can be ensured.

In accordance with the low-noise amplifier of the present invention, when a high-level disturbing wave signal which causes the gain of the transistor to be suppressed is input to the input terminal, in a case a weak electric field is input, the degree to which the gain of the transistor is suppressed can be reduced effectively by increasing the bias current fed to the transistor. Also, when the high-level disturbing wave signal is not input, the bias current fed to the transistor is not increased, and as a result, electric power consumption can be suppressed. In addition, such an advantage is achieved stably even when there is a variation in the characteristics of the elements in manufacturing, or a change or variation in the power supply voltages.

The above and further objects, features and advantages of the present invention will more fully be apparent from the following detailed description of preferred embodiments with accompanying drawings.

DETAILED DESCRIPTION OF THE PREFERRED EMBODIMENTS

Hereinafter, preferred embodiments of the present invention will be described with reference to the drawings. Throughout the drawings, the same or corresponding constituents and components are designated by the same reference symbols and will not be described respectively.

(Embodiment 1)

[Configuration of Low-Noise Amplifier]

Figure 1:
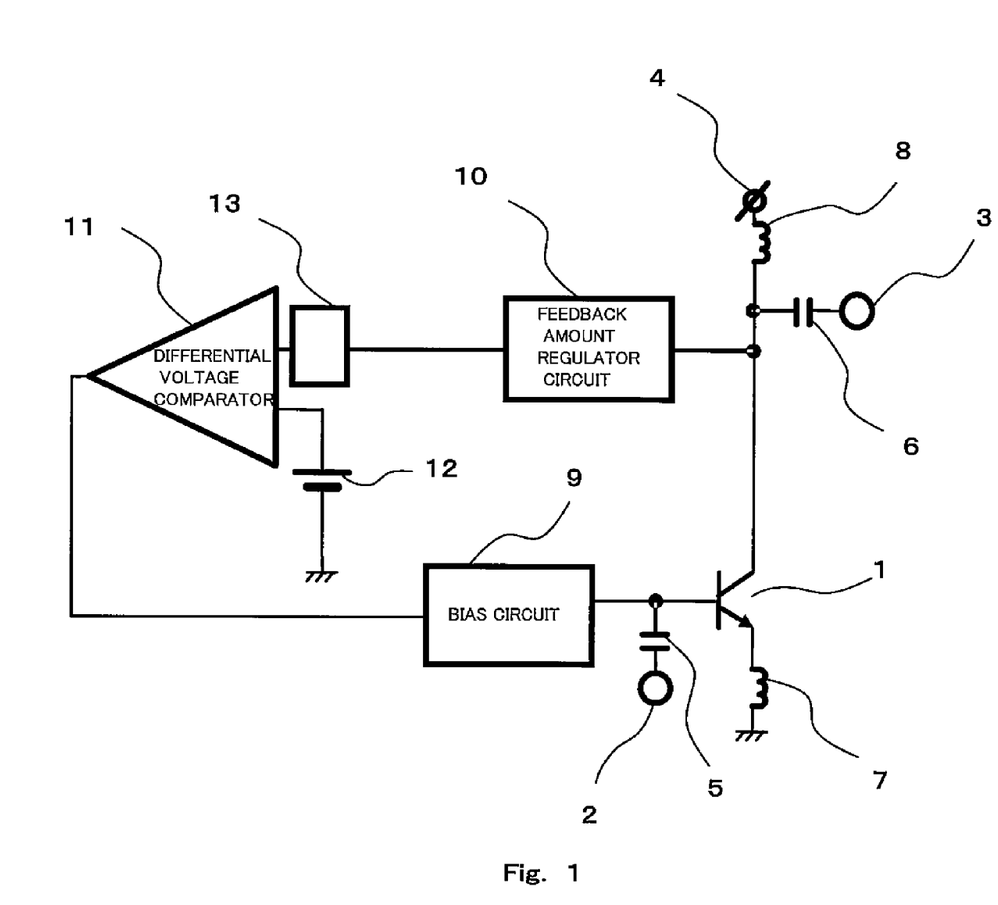
FIG. 1 is a circuit diagram showing an exemplary configuration of a low-noise amplifier according to Embodiment 1 of the present invention.

FIG. 1 is a circuit diagram showing an exemplary configuration of a low-noise amplifier according to Embodiment 1 of the present invention. Referring to FIG. 1, the low-noise amplifier includes a NPN-type transistor 1, an input terminal 2 connected to a base of the NPN-type transistor 1 via a DC cut capacitor 5, an output terminal 3 connected to a collector of the NPN-type transistor 1 via a DC cut capacitor 6, an inductor 7 connected to an emitter of the NPN-type transistor 1 and to a ground, and an inductor 8 connected to a collector of the NPN-type transistor 1 and to a power supply terminal 4.

The NPN-type transistor 1 constitutes an emitter ground circuit. The NPN-type transistor 1 amplifies a signal input from the input terminal 2 to the base via the DC cut capacitor 5 to generate an output signal and outputs the generated signal to the output terminal 3 via the DC cut capacitor 6.

The DC cut capacitor 5 is provided to remove (cut) a DC component of the signal input to the input terminal 2. The DC cut capacitor 6 is provided to remove a DC component of a collector voltage of the NPN-type transistor 1.

The inductor 7 is an impedance element provided to regulate (adjust) a gain of the NPN-type transistor 1. The inductor 8 corresponds to a collector resistor and is an impedance element provided to block an AC component that flows from the collector of the NPN-type transistor 1 to the power supply terminal 4.

The low-noise amplifier further includes a feedback amount regulator circuit 10 for regulating an amplitude of the output signal (collector voltage) of the NPN-type transistor 1 as a feedback amount of the output signal and outputting a voltage, a bias circuit 9 for generating a bias current (base current in a no-signal state) fed to the NPN-type transistor 1, a differential voltage comparator 11 which compares the output voltage of the feedback amount regulator circuit 10 to a reference voltage, determines whether or not a level of the signal input to the input terminal 2 is a level at which a gain of the transistor 1 is suppressed, and causes the bias circuit 9 to operate so as to increase the bias current fed to the NPN-type transistor 1 when it determines that the level of the signal input to the input terminal 2 is the level at which the gain of the transistor 1 is suppressed, a first input bias circuit 12 which generates the reference voltage and applies the reference voltage to one input end of the differential voltage comparator 11, and a second input bias circuit 13 which adds a bias voltage to the output voltage of the feedback amount regulator circuit 10 and applies the resulting voltage (output voltage added with the bias voltage) to the other input end of the differential voltage comparator 11.

The differential voltage comparator 11 operates the bias circuit 9 at a timing when the level of the signal input to the input terminal 2 increases up to a level at which the gain of the NPN-type transistor 1 is suppressed. To implement this timing as desired and easily, the first input bias circuit 12 and the second input bias circuit 13 pre-regulate the two input biases (bias voltages) of the differential voltage comparator 11.

[Outline of Operation of Low-Noise Amplifier]

Hereinafter, an outline of the operation of the low-noise amplifier of FIG. 1 will be described.

The signal input to the input terminal 2 is amplified by the NPN-type transistor 1 and output through the output terminal 3. At this time, a part of the output signal (collector voltage) of the NPN-type transistor 1 is input to the feedback mount regulator circuit 10 and converted into a signal with a desired level according to the impedance of the feedback amount regulator circuit 10. After that, the signal is input to the differential voltage comparator 11.

In the differential voltage comparator 11, its two input biases (bias voltages) are pre-regulated so that the differential voltage comparator 11 outputs a DC current according to a level of the input signal when the level of the input signal becomes a certain level or higher. The DC current output from the differential voltage comparator 11 is input to the bias circuit 9.

The bias circuit 9 operates so as to change the bias current fed to the NPN-type transistor 1 according to the amount of the DC current output from the differential voltage comparator 11.

When the signal input to the input terminal 2 has a low level, the voltage output from the feedback amount regulator circuit 10 has a small amplitude, and therefore, the DC current output from the differential voltage comparator 11 is substantially zero. As a result, the bias current fed to the NPN-type transistor 1 has a small current amount preset by the bias circuit 9.

On the other hand, if the level of the signal input to the input terminal 2 increases up to a level at which the gain of the NPN-type transistor 1 is suppressed, the level of the DC current output from the differential voltage comparator 11 increases up to a level according to the level of the signal input to the input terminal 2. In other words, the differential voltage comparator 11 operates the bias circuit 9 so as to increase the bias current fed to the NPN-type transistor 1. As a result, linearity of the low-noise amplifier can be improved and the degree to which the gain of the NPN-type transistor 1 is suppressed can be reduced.

[Detailed Configuration of Low-Noise Amplifier]

Figure 2:
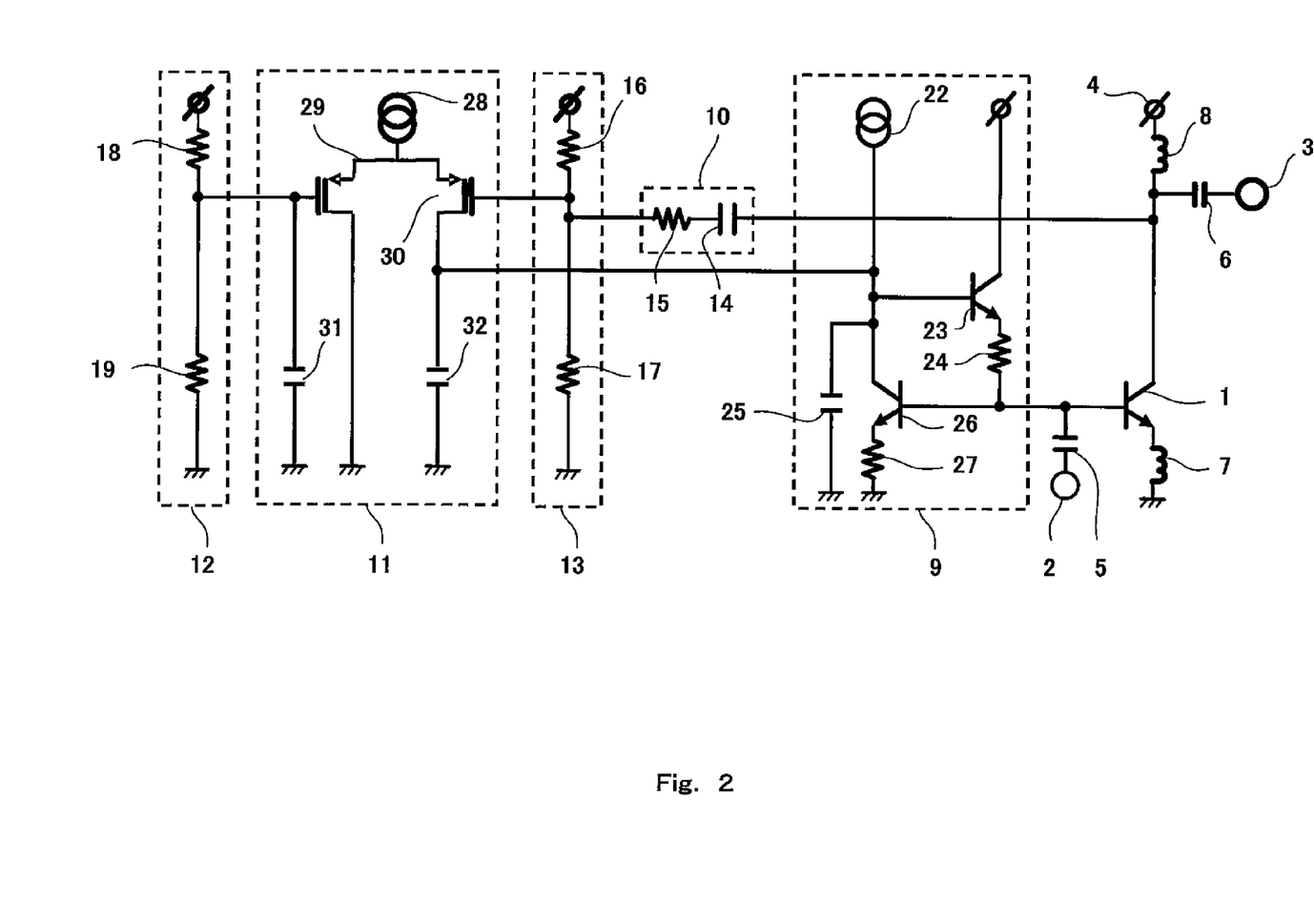
FIG. 2 is a circuit diagram showing in detail an exemplary configuration of the low-noise amplifier of FIG. 1.

FIG. 2 is a circuit diagram showing in detail an exemplary configuration of the low-noise amplifier of FIG. 1.

Referring to FIG. 2, the bias circuit 9 includes a NPN-type transistor 26 having a base connected to the base of the NPN-type transistor 1 and a collector connected to the output of the differential voltage comparator 11, a resistor 27 connected to an emitter of the NPN-type transistor 26 and to a ground, a constant current source 22 connected to a collector of the NPN-type transistor 26, a capacitor 25 connected to the collector of the NPN-type transistor 26 and to a ground, a NPN-type transistor 23 having a base connected to the collector of the NPN-type transistor 26 and a collector connected to a power supply terminal, and a resistor 24 provided between an emitter of the NPN-type transistor 23 and the base of the NPN-type transistor 1 and the base of the NPN-type transistor 26. The NPN-type transistors 1 and 26 constitute a so-called base current compensation current mirror circuit. A collector current of the NPN-type transistor 26 is duplicated as a collector current of the NPN-type transistor 1. The NPN-type transistor 23 is provided to supply a base current to each of the base of the NPN-type transistor 1 and to the base of the NPN-type transistor 26, independently of the current supplied from the constant current source 22.

The feedback amount regulator circuit 10 is configured such that a DC cut capacitor 14 is connected in series with a resistor 15 between the collector of the NPN-type transistor 1 and a connection point (gate of PMOSFET 30) at which a resistor 16 and a resistor 17 in the second input bias circuit 13 as described later are connected to each other. An impedance formed by the DC cut capacitor 14 and the resistor 15 is set sufficiently higher than a load impedance of the NPN-type transistor 1.

The first bias input circuit 12 is configured such that a resistor 18 and a resistor 19 are connected in series between a power supply terminal and a ground. A divided voltage (reference voltage) generated by dividing a power supply voltage of the power supply terminal by a resistance ratio between the resistors 18 and 19 is input to one input end of the differential voltage comparator 11.

The second input bias circuit 13 is configured such that a resistor 16 and a resistor 17 are connected in series between the power supply terminal which is the same as that of the first input bias circuit 12 and a ground. A divided voltage generated by dividing a power supply voltage of the power supply terminal by a resistance ratio between the resistors 16 and 17 is input to the other input end of the differential voltage comparator 11. The differential voltage comparator 11 includes a pair of PMOSFETs 29 and 30 having sources connected to a constant current source 28.

A gate of the PMOSFET 29 corresponds to one input end of the differential voltage comparator 11. The divided voltage (reference voltage) supplied from the first input bias circuit 12 is applied to the gate of the PMOSFET 29. The gate of the PMOSFET 29 is connected to a ground via a capacitor 31. A drain of the PMOSFET 29 is connected to a ground.

A gate of the PMOSFET 30 corresponds to the other input end of the differential voltage comparator 11. The divided voltage supplied from the second input bias circuit 13 is applied to the gate of the PMOSFET 30. A drain of the PMOSFET 30 is connected to the collector of the NPN-type transistor 26 in the bias circuit 9 and connected to a ground via a capacitor 32.

The two bias voltages of the differential voltage comparator 11 are pre-regulated so that the divided voltage of the second input bias circuit 13 connected with the feedback amount regulator circuit 10 is higher than the divided voltage of the first input bias circuit 12 connected with the feedback amount regulator circuit 10. In other words, in a state where a low electric is field is input, the PMOSFET 29 is ON and the PMOSFET 30 is OFF.

[Detailed Operation of Low-Noise Amplifier]

Hereinafter, a detailed operation of the low-noise amplifier of FIG. 2 will be described.

As described above, the bias circuit 9 has a configuration of the base current compensation current mirror circuit and operates so as to increase the bias current fed to the NPN-type transistor 1 according to the amount of the current supplied from the differential voltage comparator 11.

When the signal input to the low-noise amplifier has a low level, the divided voltage applied from the feedback amount regulator circuit 10 to the input end of the differential voltage comparator 11 via the second input bias circuit 13 has a very small amplitude. In this case, according to default regulation, the PMOSFET 30 is OFF and the PMOSFET 29 is ON, so that the current supplied from the constant current source 28 substantially flows to the PMOSFET 29. Thereby, the amount of current supplied from the differential voltage comparator 11 to the bias circuit 9 is substantially zero and the bias current fed to the NPN-type transistor 1 has a small amount defined by the constant current source 22. To be specific, a collector current with an amount corresponding to the amount of the current supplied from the constant current source 22 flows through the NPN-type transistor 26 and is duplicated as the collector current of the NPN-type transistor 1. A part of the current supplied from the constant current source 22 to the NPN-type transistor 26 is supplied to the base of the NPN-type transistor 23. The NPN-type transistor 23 amplifies the part of the current and distributes it to the base of the NPN-type transistor 1 and the base of the NPN-type transistor 26.

In contrast, in a case where the level of the input signal increases up to a level at which the gain of the NPN-type transistor 1 is suppressed, the divided voltage applied from the feedback amount regulator circuit 10 to the input end of the differential voltage comparator 11 via the second input bias circuit 13 has a great amplitude. As a result, according to the amplitude of the divided voltage applied from the feedback amount regulator circuit 10 to the input end of the differential voltage comparator 11 via the second input bias circuit 13, a magnitude relationship between the gate voltage of the PMOSFET 30 and the gate voltage of the PMOSFET 29 changes. During a period of time when the gate voltage of the PMOSFET 30 is lower than the gate voltage of the PMOSFET transistor 29, the PMOSFET 30 is ON and the PMOSFET 29 is OFF. At this time, a DC current with an amount corresponding to the amplitude of the divided voltage of the second input bias circuit 13 flows through the PMOSFET 30 and is supplied to the bias circuit 9. To be specific, a collector current with an amount which is a sum of a current amount of the constant current source 22 and a current supply amount of the differential voltage comparator 11 flows through the NPN-type transistor 26 and is duplicated as the collector current of the NPN-type transistor 1. A part of the current supplied from the constant current source 22 and the differential voltage comparator 11 to the NPN-type transistor 26 is supplied to the base of the NPN-type transistor 23. The NPN-type transistor 23 amplifies the part of the current and distributes the amplified current to the base of the NPN-type transistor 1 and to the base of the NPN-type transistor 26.

As described above, in a case where the level of the input signal increases up to a level at which the gain of the NPN-type transistor 1 is suppressed, the bias current fed to the NPN-type transistor 1 is increased. Thus, linearity of the low-noise amplifier can be improved and the degree to which the gain of the NPN-type transistor 1 is suppressed can be reduced. It should be noted that a level of the disturbing wave signal at which the bias current fed to the NPN-type transistor 1 begins to increase is determined by a difference between the divided voltage of the first input bias circuit 12 and the divided voltage of the second input bias circuit 13. For this reason, even when the power supply voltage supplied to the low-noise amplifier varies, the level of the disturbing wave signal at which the bias current fed to the NPN-type transistor 1 begins to increase does not vary. As a result, the effect of reducing the degree to which the gain of the NPN-type transistor 1 is suppressed is achieved stably.

[Advantage]

Figure 3:
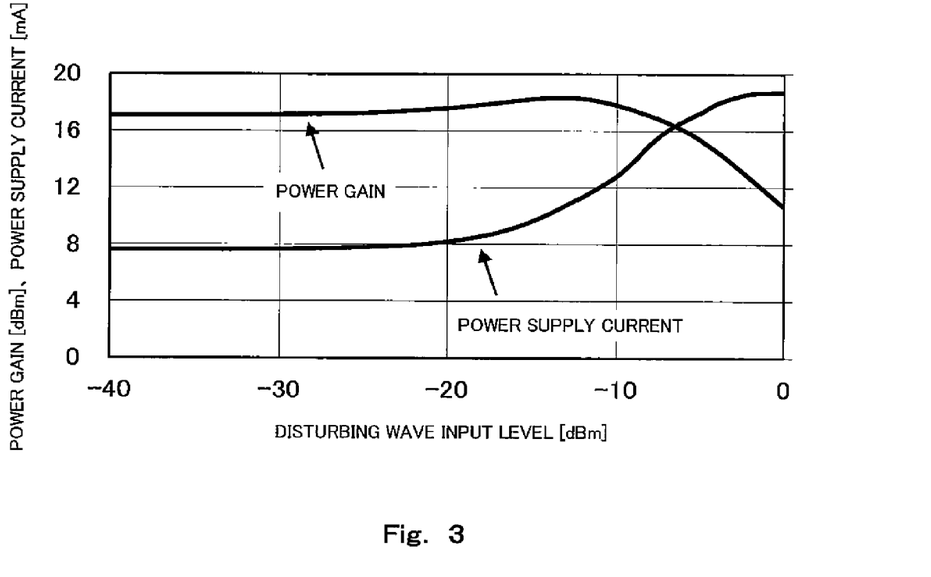
FIG. 3 is a graph showing characteristic changes in a power gain and a power supply current according to an input level of a disturbing wave signal in the low-noise amplifier according to Embodiment 1.
Figure 4:
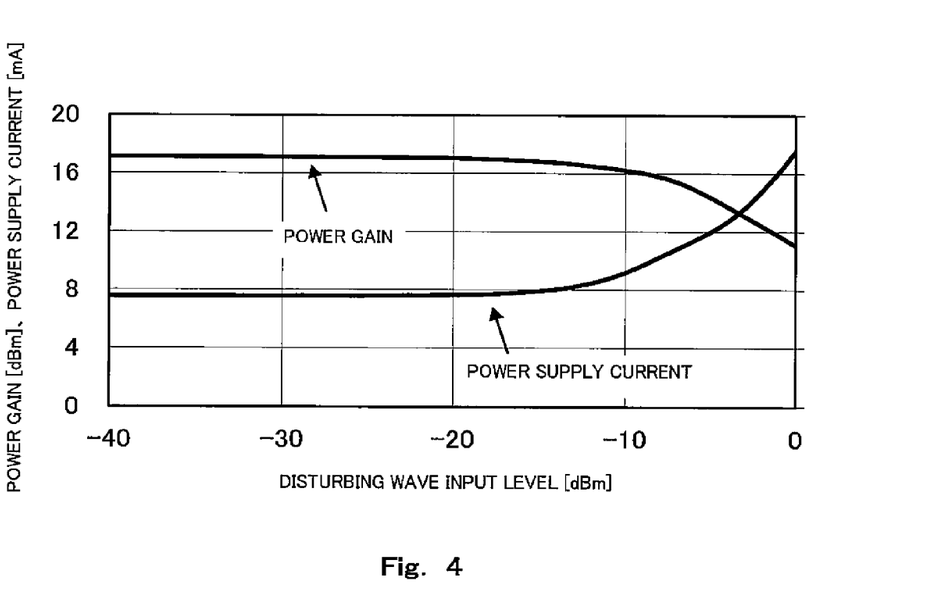
FIG. 4 is a graph showing characteristic changes in a power gain and a power supply current according to an input level of a disturbing wave signal in a low-noise amplifier according to Comparative Example.

FIG. 3 is a graph showing characteristic changes in a power gain and a power supply current according to the input level of the disturbing wave signal in the low-noise amplifier according to Embodiment 1. FIG. 4 is a graph showing characteristic changes in a power gain and a power supply current according to an input level of a disturbing wave signal in the low-noise amplifier according to Comparative Example (prior art example).

When comparison is made between the characteristic of FIG. 3 and the characteristic of FIG. 4, they are substantially the same when the input level of the disturbing wave signal is low. On the other hand, when the input level of the disturbing wave signal is high, the power supply current increases due to an increase in the bias current fed to the NPN-type transistor 1, but linearity of the low-noise amplifier improves, in the characteristic of FIG. 3 as compared to the characteristic of FIG. 4.

As described above, in accordance with the low-noise amplifier of Embodiment 1, when a high-level disturbing wave signal is input in a case a weak electric field is input, the degree to which the gain of the NPN-type transistor 1 is suppressed can be reduced effectively. In addition, such an advantage is achieved even when there is a variation in the characteristic of the element in manufacturing, or a change or variation in the power supply voltage.

[Modified Example]

The NPN-type transistor 1 may be replaced with a PNP-type transistor, a NMOSFET, or a PMOSFET, although a configuration of a peripheral circuit is altered when using these transistors.

Although the differential voltage comparator 11 is configured to output the DC current to the bias circuit 9, it may be configured to output an AC current and the bias circuit 9 may be configured to convert the AC current output from the differential voltage comparator 11 into the DC current.

Since similar advantage is achieved so long as the first and second input bias circuits 12 and 13 in the differential voltage comparator 11 have the same configuration, the circuit configuration of them is not particularly limited to a configuration in which two resistors are connected in series.

The feedback amount regulator circuit 10 may be constituted by only resistors or only capacitors, or may be configured such that an inductor and a capacitor are connected in series, depending on setting of a frequency or a voltage amplitude of a feedback signal.

(Embodiment 2)

Figure 5:
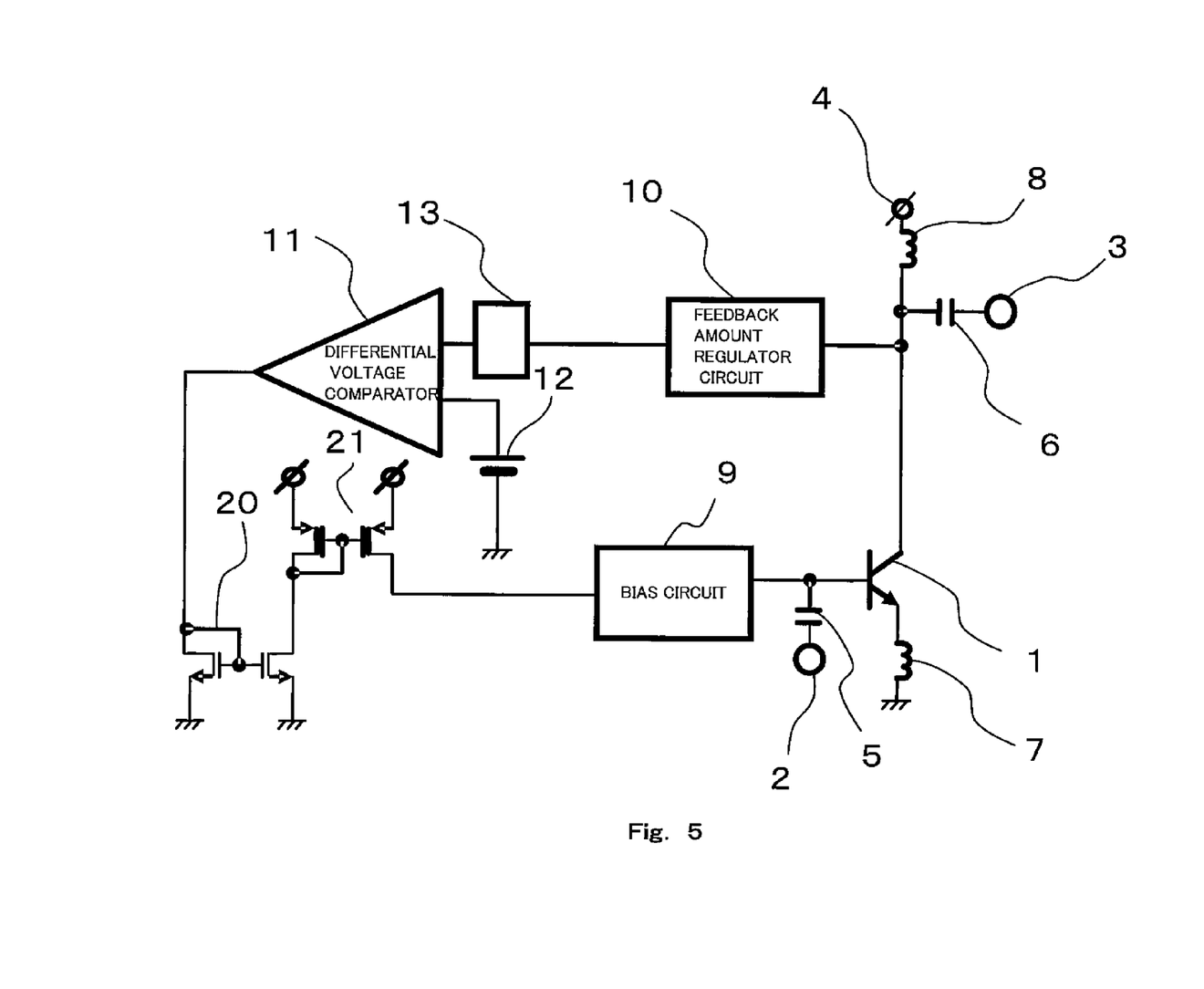
FIG. 5 is a circuit diagram showing an exemplary configuration of a low-noise amplifier according to Embodiment 2 of the present invention.

FIG. 5 is a circuit diagram showing an exemplary configuration of a low-noise amplifier according to Embodiment 2 of the present invention.

The low-noise amplifier of FIG. 5 is different from the low-noise amplifier of FIG. 1 in that current mirror circuits 20 and 21 are connected to each other between the output of the differential voltage comparator 11 and the input of the bias circuit 9, in the low-noise amplifier of FIG. 1 of FIG. 5. The current mirror circuit 20 includes a pair of NMOSFETs, while the current mirror circuit 21 includes a pair of PMOSFETs. In Embodiment 2, the exemplary configuration of FIG. 2 may be used as the configuration of the bias circuit 9, the feedback amount regulator circuit 10, the first input bias circuit 12, the second input bias circuit 13 and the differential voltage comparator 11.

In a case where the level of the disturbing wave signal increases up to a level at which the gain of the NPN-type transistor 1 is suppressed, in the low-noise amplifier configured as shown in FIG. 5, the amount of the DC current supplied from the differential voltage comparator 11 to the bias circuit 9 can be set to a desired current amount according to a current mirror ratio between the current mirror circuits 20 and 21, and hence an increase amount of the bias current fed to the NPN-type transistor 1 can be regulated (adjusted) easily.

An electric potential at a connection point where the bias circuit 9 is connected to the current mirror circuit 21, rises, with an increase in the bias current of the NPN-type transistor 1. Therefore, during low-voltage driving, a changing magnitude of the bias current fed to the NPN-type transistor 1 is restricted by an amount corresponding to a drop (decrease) amount of the power supply voltage. However, in the present embodiment, a drop (decrease) amount of the voltage in the current mirror circuit 21 corresponds to only a drain-source voltage of the PMOSFET. Therefore, during low-voltage driving, a changing magnitude of the bias current fed to the NPN-type transistor 1 can be ensured.

Instead of the configuration of the two current mirror circuits 20 and 21, one or three or more current mirror circuits may be connected to each other. Although the current mirror circuit includes a pair of MOSFETs, it may include bipolar transistors instead of the MOSFETs.

A low-noise amplifier of the present invention is useful as a low-noise amplifier incorporated into portable communication devices required to operate with low current consumption, receiver sections of communication devices which incorporate a plurality of communication systems and are required to have high-resistance to disturbing wave signals, and so on.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A low-noise amplifier comprising:
an input terminal to which a signal is input;
a transistor configured to amplify the signal input to the input terminal;
an output terminal through which the amplified signal from the transistor is output;
a feedback amount regulator circuit configured to regulate an amplitude of the amplified signal output from the transistor as a feedback amount and output a voltage;
a bias circuit configured to generate a bias current fed to the transistor;
a differential voltage comparator configured to compare the voltage output from the feedback amount regulator circuit to a reference voltage, determine whether or not a level of the signal input to the input terminal is a level at which a gain of the transistor is suppressed, and increase the bias current fed to the transistor when the differential voltage comparator determines that the level of the signal input to the input terminal is the level at which the gain of the transistor is suppressed;
a first input bias circuit configured to generate the reference voltage and apply the reference voltage to one input end of the differential voltage comparator; and
a second input bias circuit configured to add a bias voltage to the voltage output from the feedback amount regulator circuit and apply the voltage added with the bias voltage to the other input end of the differential voltage comparator,
wherein the first input bias circuit includes a plurality of resistors connected in series between a power supply terminal and a ground, and is configured to apply a divided voltage generated by dividing a power supply voltage of the power supply terminal by the plurality of resistors to the one input end of the differential voltage comparator; and
the second input bias circuit includes a plurality of resistors connected in series between a power supply terminal and a ground, and is configured to add a divided voltage generated by dividing a power supply voltage of the power supply terminal by the plurality of resistors to the voltage output from the feedback amount regulator circuit and apply the voltage added with the divided voltage, to the other input end of the differential voltage comparator.

2. The low-noise amplifier according to claim 1, wherein the feedback amount regulator circuit has a configuration in which a resistor and a direct current cut capacitor are connected in series.

3. A low-noise amplifier comprising:
an input terminal to which a signal is input;
a transistor configured to amplify the signal input to the input terminal;
an output terminal through which the amplified signal from the transistor is output;
a feedback amount regulator circuit configured to regulate an amplitude of the amplified signal output from the transistor as a feedback amount and output a voltage;
a bias circuit configured to generate a bias current fed to the transistor;
a differential voltage comparator configured to compare the voltage output from the feedback amount regulator circuit to a reference voltage, determine whether or not a level of the signal input to the input terminal is a level at which a gain of the transistor is suppressed, and increase the bias current fed to the transistor when the differential voltage comparator determines that the level of the signal input to the input terminal is the level at which the gain of the transistor is suppressed;

a first input bias circuit configured to generate the reference voltage and apply the reference voltage to one input end of the differential voltage comparator; and a second input bias circuit configured to add a bias voltage to the voltage output from the feedback amount regulator circuit and apply the voltage added with the bias voltage to the other input end of the differential voltage comparator, wherein a signal output from the differential voltage comparator is input to the bias circuit via at least one current mirror circuit.

4. The low-noise amplifier according to claim 3, wherein the feedback amount regulator circuit has a configuration in which a resistor and a direct current cut capacitor are connected in series.

* * * * *